(12) United States Patent
Jocham et al.

(10) Patent No.: US 10,894,559 B2
(45) Date of Patent: Jan. 19, 2021

(54) POWER UNIT FOR AN ELECTRICAL STEERING SYSTEM

(71) Applicant: Robert Bosch GmbH, Stuttgart (DE)

(72) Inventors: Reinhold Jocham, Hechingen (DE); Andreas Falkenburger, Reutlingen (DE); Dieter Roeschner, Reutlingen (DE); Andreas Kaufmann, Sontheim an der Brenz (DE); Christoph Ruf, Eningen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/316,772

(22) PCT Filed: Jun. 14, 2017

(86) PCT No.: PCT/EP2017/064618
§ 371 (c)(1),
(2) Date: Jan. 10, 2019

(87) PCT Pub. No.: WO2018/010907
PCT Pub. Date: Jan. 18, 2018

(65) Prior Publication Data
US 2019/0241209 A1 Aug. 8, 2019

(30) Foreign Application Priority Data
Jul. 14, 2016 (DE) .......................... 10 2016 212 862

(51) Int. Cl.
*H02K 9/22* (2006.01)
*H02K 11/33* (2016.01)
(Continued)

(52) U.S. Cl.
CPC ............. *B62D 5/0406* (2013.01); *H02K 9/22* (2013.01); *H02K 11/33* (2016.01); *H02K 15/14* (2013.01);
(Continued)

(58) Field of Classification Search
CPC ............ H02K 11/33; H02K 5/15; F28D 7/005
(Continued)

(56) References Cited

U.S. PATENT DOCUMENTS 3,143,897 A * 8/1964 Kohn .................... H02K 7/1163
74/606 R
3,824,684 A * 7/1974 Wheeler ................. B25F 5/008
29/596

(Continued)

FOREIGN PATENT DOCUMENTS

DE  20 2009 008 803 U1  10/2009
DE  10 2009 000 169 A1  7/2010
(Continued)

OTHER PUBLICATIONS

Machine Translation JP2012249371A (Year: 2012).*
(Continued)

*Primary Examiner* — Jose A Gonzalez Quinones
(74) *Attorney, Agent, or Firm* — Maginot, Moore & Beck LLP

(57) ABSTRACT

A power unit for an electrical steering system includes a motor housing for accommodating a motor, a heat sink and a drive electronics system, which is arranged on the heat sink, for the motor. The heat sink and the motor housing are connected to one another in such a way that heat exchange from the drive electronics system, via the heat sink, to the motor housing is possible. The heat sink is at least partially connected to the motor housing by calking or welding or screwing. A method is used for assembling a power unit having a motor housing for accommodating a motor, a heat sink and a drive electronics system, which is arranged on the heat sink, for the motor. A connection is established between the heat sink and the motor housing by calking or welding or screwing.

19 Claims, 3 Drawing Sheets

(51) Int. Cl.
*H02K 15/14* (2006.01)
*B62D 5/04* (2006.01)
*H05K 7/20* (2006.01)

(52) U.S. Cl.
CPC ......... *H05K 7/209* (2013.01); *H05K 7/20854* (2013.01)

(58) Field of Classification Search
USPC .......................................... 310/75 R, 89, 64
See application file for complete search history.

(56) References Cited

U.S. PATENT DOCUMENTS

| | | | | |
|---|---|---|---|---|
| 6,374,912 | B1* | 4/2002 | LaGrotta | H05K 5/061 165/185 |
| 8,149,574 | B2* | 4/2012 | Lin | H01L 23/467 174/16.3 |
| 10,476,341 | B2* | 11/2019 | Pondelek | F16H 61/0006 |
| 2005/0141193 | A1* | 6/2005 | Otsuki | H01L 23/467 361/695 |
| 2009/0078489 | A1* | 3/2009 | Feier | F16H 61/0006 180/339 |
| 2010/0111730 | A1* | 5/2010 | Peterreins | F04D 13/0626 417/423.7 |
| 2011/0254411 | A1* | 10/2011 | Minato | H02M 7/003 310/68 C |
| 2012/0031215 | A1* | 2/2012 | Feier | H02K 11/33 74/473.12 |
| 2012/0091865 | A1 | 4/2012 | Knoedler et al. | |
| 2013/0134336 | A1* | 5/2013 | Lin | F16K 11/0743 251/129.12 |
| 2014/0326530 | A1* | 11/2014 | Asao | B62D 5/0406 180/443 |
| 2015/0216083 | A1* | 7/2015 | Kanazawa | H02K 9/00 310/52 |
| 2015/0333596 | A1* | 11/2015 | Berkouk | H02K 11/40 310/71 |
| 2016/0006324 | A1 | 1/2016 | Akutsu et al. | |
| 2017/0203722 | A1* | 7/2017 | Shoda | B60S 1/08 |

FOREIGN PATENT DOCUMENTS

| | | |
|---|---|---|
| DE | 10 2009 001 942 A1 | 9/2010 |
| DE | 10 2015 214 474 A1 | 2/2016 |
| DE | 10 2014 012 946 A1 | 3/2016 |
| DE | 10 2014 018 745 A1 | 6/2016 |
| GB | 2 251 522 A | 7/1992 |
| JP | H10-086831 A | 4/1998 |
| JP | 2000-313345 A | 11/2000 |
| JP | 2002-345211 A | 11/2002 |
| JP | 2006-335259 A | 12/2006 |
| JP | -2012249371 A * | 12/2012 |
| JP | 2012249371 A * | 12/2012 |
| JP | 2013-066900 A | 4/2013 |
| JP | 2013-229972 A | 11/2013 |
| JP | 2014-117005 A | 6/2014 |
| JP | 2015-116650 A | 6/2015 |
| JP | 2015-134598 A | 7/2015 |
| JP | 2015-202049 A | 11/2015 |
| JP | 2016-032837 A | 3/2016 |
| JP | 2016-073098 A | 5/2016 |
| WO | 2014/157399 A1 | 10/2014 |
| WO | 2014/188803 A1 | 11/2014 |
| WO | 2016/075821 A1 | 5/2016 |

OTHER PUBLICATIONS

International Search Report corresponding to PCT Application No. PCT/EP2017/064618, dated Sep. 14, 2017 (German and English language document) (7 pages).

* cited by examiner

POWER UNIT FOR AN ELECTRICAL STEERING SYSTEM

This application is a 35 U.S.C. § 371 National Stage Application of PCT/EP2017/064618, filed on Jun. 14, 2017, which claims the benefit of priority to Serial No. DE 10 2016 212 862.0, filed on Jul. 14, 2016 in Germany, the disclosures of which are incorporated herein by reference in their entireties.

BACKGROUND

The disclosure is based on a power unit for an electrical steering system comprising a motor housing for accommodating a motor, a heat sink and a drive electronics system, which is arranged on the heat sink, for the motor. The heat sink and the motor housing are connected to one another in such a way that heat exchange from the drive electronics system, via the heat sink, to the motor housing is possible.

A power unit of this kind is disclosed, for example, in laid-open specification DE 10 2009 000 169 A1. In this specification, the heat sink is connected to the motor housing by means of shrink-fitting. During assembly of the power unit, the motor housing for example is heated, the heat sink is then inserted into the motor housing and the motor housing is subsequently cooled down again in order to achieve a shrink-fit.

Owing to the connection between the heat sink and the motor housing, the heat which is generated by the drive electronics system due to power loss can be dissipated via the motor housing.

The disclosure additionally relates to a method for assembling a power unit.

SUMMARY

The disclosure is based on a power unit for an electrical steering system comprising a motor housing for accommodating a motor, a heat sink and a drive electronics system, which is arranged on the heat sink, for the motor. The heat sink and the motor housing are connected to one another in such a way that heat exchange from the drive electronics system, via the heat sink, to the motor housing is possible.

The essence of the disclosure is that the heat sink is at least partially connected to the motor housing by means of calking or else welding or else screwing.

It is advantageous here that, owing to a connection by means of calking or else welding or else screwing for thermally connecting the heat sink to the motor housing, a lower overall height of the power unit can be achieved in contrast to a connection by means of shrink-fitting. The reason for this is that, in the case of shrink-fitting, a certain minimum distance is required between the heat sink and the motor contained in the motor housing, in particular the end plate of the motor, on account of the usually inductive heating during assembly of the power unit, whereas a minimum distance of this kind is not required in the case of calking or else welding or else screwing and therefore the overall height of the power unit can be kept low.

An advantageous refinement of the disclosure makes provision for the heat sink, in its main plane of extent, to at least partially protrude beyond the motor housing on an end side of the motor housing in which an opening of the motor housing is located.

It is advantageous here that the surface area of the heat sink is greater than the cross-sectional area of the motor housing on its end side, this firstly rendering it possible for a greater number of electrical components of the drive electronics system of the motor to be arranged on the heat sink. Secondly, components can be arranged on both sides of the heat sink in the region of the heat sink which protrudes beyond the motor housing. As a result, for example components which are very large and would therefore increase the overall height of the power unit can be arranged on the bottom side of the heat sink and therefore to the side of and outside the motor housing, wherein this does not lead to an increase in the overall height of the power unit. In addition, for example connection plugs for the drive electronics system can be arranged to the side of the motor housing.

According to an advantageous refinement of the disclosure, provision is made for an end side of the motor housing in which an opening of the motor housing is located to be of stepped design.

It is advantageous here that the heat sink can therefore be connected to the motor housing in a manner bearing partially on an inner wall of the motor housing and partially on the end side of the motor housing. This provides good mechanical connection and accordingly good thermal conductivity between the heat sink and the motor housing.

According to a further advantageous refinement of the disclosure, provision is made for the calking to be formed by means of at least one bent or riveted lug, which is formed on an end side of the motor housing which forms an opening of the cup-like motor housing, and at least one associated recess in the heat sink.

It is advantageous here that this provides a good way of connecting the heat sink to the motor housing in a thermally closely fitting manner, as a result of which heat exchange between the heat sink and the motor housing is ensured. Furthermore, the overall height of the power unit is either not increased at all or is increased only insignificantly owing to the bending or riveting of the lug.

In an advantageous embodiment of the disclosure, provision is made for the heat sink to be at least partially calked with the motor housing by way of the heat sink having a groove on an end side of the heat sink and the motor housing having a tongue on an inner wall of the motor housing, which groove and tongue are calked one into the other.

It is advantageous here that a closely fitting connection between the heat sink and the motor housing is achieved, this connection having a low thermal resistance.

In a further advantageous embodiment of the disclosure, provision is made for the motor housing to at least partially have a gap on an end side of the motor housing in a region in which the motor housing has the tongue on the inner wall of the motor housing.

It is advantageous here that, on account of the gap, the motor housing can be calked with the heat sink more easily. Therefore, a calking tool can be inserted into the gap through recesses in the heat sink from above and the motor housing can be calked with the heat sink, in particular the tongue can be calked with the groove, by means of sufficient application of force.

In a further advantageous embodiment of the disclosure, provision is made for a screw to engage into a thread, which is formed in the motor housing, through an aperture in the heat sink and therefore to form the connection between the heat sink and the motor housing.

It is advantageous here that this provides an uncomplicated way of thermally connecting the heat sink to the motor housing.

According to an advantageous refinement of the disclosure, provision is made for laser beam welding to be used for welding purposes.

It is advantageous here that accurately positioned connection between the heat sink and the motor housing can be achieved in this way, wherein complicated seam geometries can also be implemented.

According to a further advantageous refinement of the disclosure, provision is made for the heat sink to have at least one recess, wherein an edge of the recess at least partially bears on an end side of the motor housing in which an opening of the motor housing is located, and the motor housing is welded to the heat sink at least partially along the bearing edge.

It is advantageous here that this creates a particularly stable connection between the motor housing and the heat sink.

According to a further advantageous refinement of the disclosure, provision is made for the heat sink with the drive electronics system arranged on it to be at least partially enclosed by an additional housing, in particular a plastic housing.

It is advantageous here that the additional housing protects the drive electronics system of the motor against environmental influences and therefore the service life of the power unit is increased.

According to a further advantageous refinement of the disclosure, provision is made for the motor housing or else the heat sink to be formed from a wrought aluminum alloy by means of deep drawing.

It is advantageous here that the wrought aluminum alloy has a high thermal conductivity, as a result of which heat exchange between the drive electronics system, the heat sink and the motor housing is improved. In addition, deep drawing constitutes a technically simple way of producing the heat sink or else the motor housing. Here, in contrast to pressure die-casting, casting molds which have to be regularly replaced are not required. Therefore, the power unit can be produced in a more cost-effective manner.

The disclosure additionally relates to a method for assembling a power unit having a cup-like motor housing for accommodating a motor, a heat sink and a drive electronics system, which is arranged on the heat sink, for the motor. In said method, a connection between the heat sink and the motor housing is made by means of calking or else welding or else screwing.

It is advantageous here that, owing to a connection by means of calking or else welding or else screwing for thermally connecting the heat sink to the motor housing, a lower overall height of the power unit can be achieved in contrast to a connection by means of shrink-fitting. The reason for this is that, in the case of shrink-fitting, a certain minimum distance is required between the heat sink and the motor contained in the motor housing, in particular the end plate of the motor, on account of the usually inductive heating during assembly of the power unit, whereas a minimum distance of this kind is not required in the case of calking or else welding or else screwing and therefore the overall height of the power unit can be kept low.

In an advantageous refinement of the method according to the disclosure, provision is made, after the connection is made, for a first housing shell to be pushed onto the motor housing and fixed, in particular adhesively bonded, to an outer wall of the motor housing and then for a second housing shell to be mounted and connected to the first housing shell, in particular by means of laser beam welding.

It is advantageous here that the additional housing which is formed from the first housing shell and the second housing shell protects the drive electronics system of the motor against environmental influences and therefore the service life of the power unit is increased.

According to an advantageous refinement of the method according to the disclosure, provision is made for the motor housing or else the heat sink to be produced by means of deep drawing a wrought aluminum alloy.

It is advantageous here that the wrought aluminum alloy has a high thermal conductivity, as a result of which the heat exchange between the drive electronics system, the heat sink and the motor housing is improved. In addition, deep drawing constitutes a technically simple way of producing the heat sink or else the motor housing. Here, in contrast to pressure die-casting, casting molds which have to be regularly replaced are not required. Therefore, the power unit can be produced in a more cost-effective manner.

DETAILED DESCRIPTION

Figure 1A:
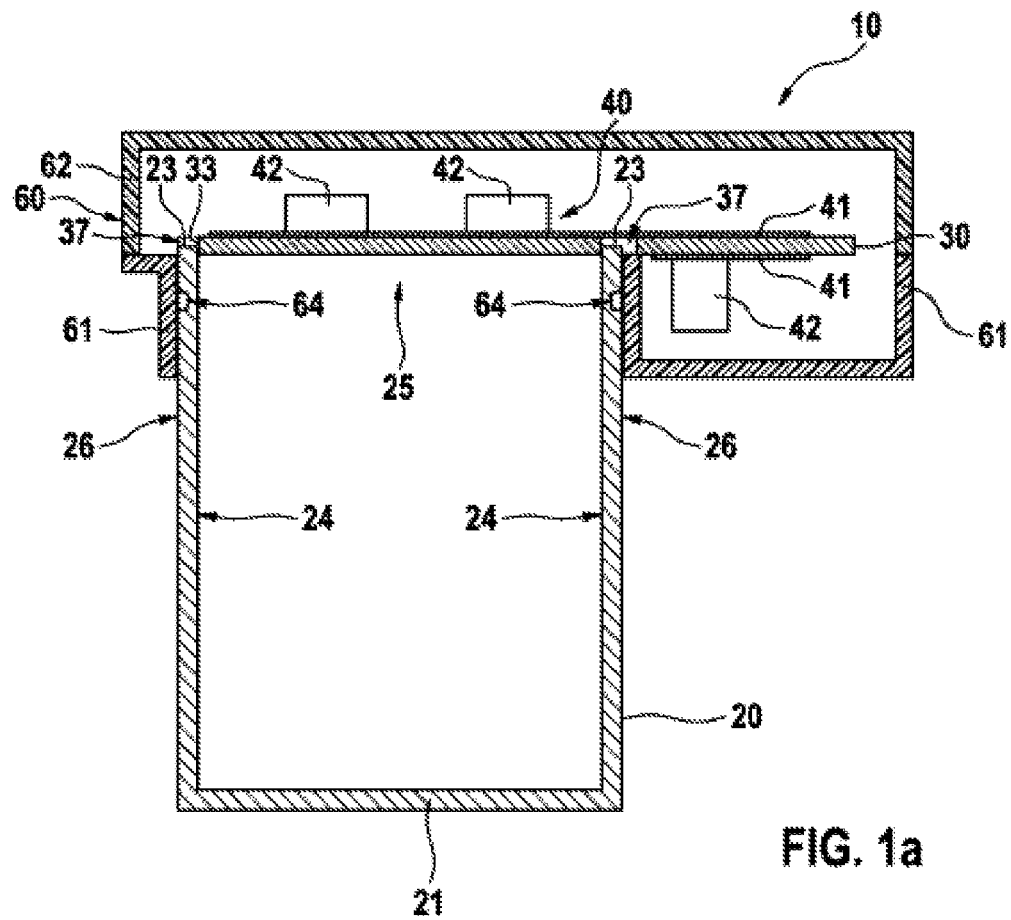
FIG. 1a shows a cross section through a first exemplary embodiment of a power unit according to the disclosure for an electrical steering system.

FIG. 1 shows a cross section through a first exemplary embodiment of a power unit 10 according to the disclosure for an electrical steering system. The power unit 10 comprises a cup-like motor housing 20 for a motor, not illustrated, usually an electric motor. Here, this cup-like motor housing 20 has a base 21 through which a motor shaft, not illustrated, of the motor usually passes. In FIG. 1, the base 21 has a circular base area, as a result of which the motor housing 20 is of cylindrical configuration. However, a square base area or else a differently shaped base area of the base 21 is also conceivable. The motor housing 20 has an opening 25 on a side which is situated opposite the base 21. Furthermore, the power unit 10 comprises a heat sink 30, which has a main plane of extent, and a drive electronics system 40 which is arranged on the heat sink 30 and serves for driving the motor. The drive electronics system 40 is, for example, in the form of a printed circuit board 41 with electrical components 42 arranged on it. These electrical components 42 can be, for example, switches or diodes of the inverter which is required for driving the motor or else capacitors or parts of the logic unit for controlling the driving operation. The printed circuit board 41 is fitted on the heat sink 30 by means of a thermally conductive adhesive for example.

Furthermore, the heat sink 30 is connected to the motor housing 20 in such a way that heat exchange between the heat sink 30 and the motor housing 20 is possible and therefore, in particular, the heat which is generated by the drive electronics system 40 can be emitted to the motor housing 20 via the heat sink 30. Here, the heat sink 30 is arranged in such a way that the opening 25 of the motor housing 20 is substantially closed, as a result of which the heat sink 30 serves as a kind of cover for the motor housing 20. In addition, the heat sink 30 at least partially rests against an end side 23 of the motor housing 20 in which the opening 25 of the motor housing 20 is located and additionally at least partially protrudes, in its main plane of extent, beyond the motor housing 20. At another point on the motor housing 20, the heat sink 30, by way of an end side 33, bears against an inner wall 24 of the motor housing 20. In addition, the heat sink 30 has recesses 37 which render possible access to the end side 23 of the motor housing 20. The different ways of forming a connection between the heat sink 30 and the motor housing 20 are illustrated in detail in FIGS. 2 to 5. The heat sink 30 with the drive electronics system 40 arranged on it is additionally at least partially surrounded by an additional housing 60. This additional housing 60 is, for example, composed of plastic and is formed from a first housing half 61 and a second housing half 62. The first housing half 61 is pushed over the motor housing 20 or pressed onto the motor housing 20 and fixed to said motor housing at an outer wall 26 of the motor housing 20. In this case, fixing is performed by means of adhesive bonding along a sealing contour 64. This provides sealing-off between the housing half 61 and the motor housing 60. The second housing half 62 is mounted and connected to the first housing half 61, for example by means of laser beam welding or else likewise by means of adhesive bonding.

In an alternative exemplary embodiment, not illustrated in the figures, the electrical components 42 can also be at least partially arranged directly, that is to say without printed circuit board 41, on the heat sink 30.

Figure 1B:
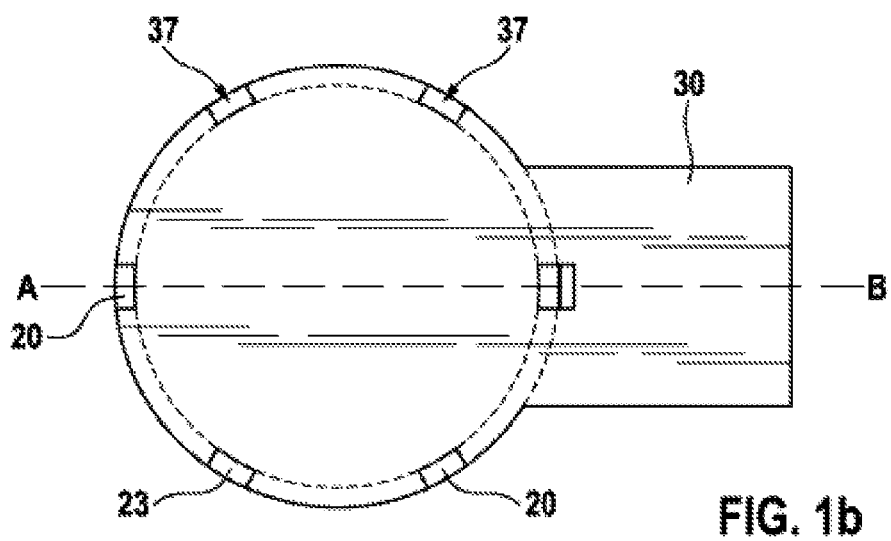
FIG. 1b shows a plan view of the first exemplary embodiment of a power unit according to the disclosure for an electrical steering system.

FIG. 1b shows a plan view of the first exemplary embodiment of a power unit 10 according to the disclosure for an electrical steering system. Here, the power unit 10 is illustrated without the drive electronics system 40 and the additional housing 60. Said figure additionally illustrates a straight dashed line from A to B along which the cross section according to FIG. 1 is routed through. Here, the heat sink 30 rests on the end side 23 of the motor housing 20, wherein recesses 37 are formed in the heat sink 30 in order to create access to the end face 23 of the motor housing 20. Furthermore, the heat sink 30, in its main plane of extent, at least partially protrudes beyond the motor housing 20 at the end side 23 of the motor housing 20.

Figure 2:
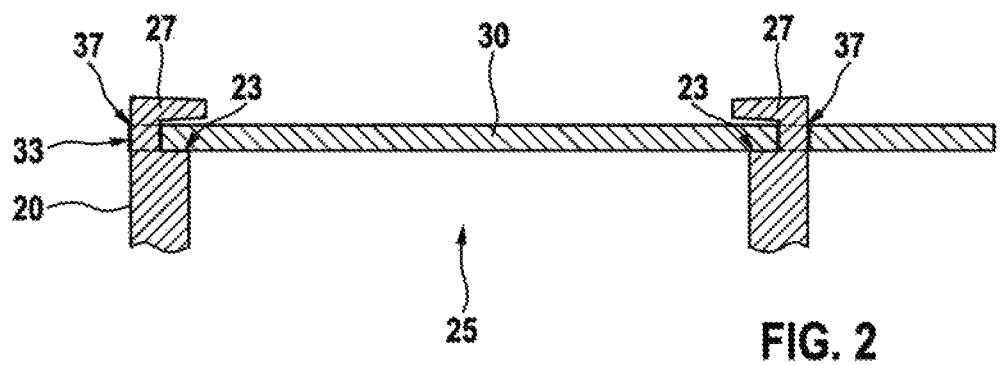
FIG. 2 shows a cross section through a second exemplary embodiment of a connection according to the disclosure between the heat sink and the motor housing.

FIG. 2 shows a cross section through a second exemplary embodiment of a connection according to the disclosure between the heat sink and the motor housing. Lugs 27 in the form of projections from the motor housing 20 are formed on an end side 23 of the motor housing 20. These lugs 27 pass through associated recesses 37 of the heat sink 30 and, after passing through the recesses 37, are bent in such a way that the heat sink 30 is fixed on the end side 23 of the motor housing 20 and heat exchange between the heat sink 30 and the motor housing 20 is possible. The recesses 37 can be either complete apertures in the heat sink 30 or else merely cutouts on an end side 33 of the heat sink 30.

In an alternative exemplary embodiment, not illustrated in the figures, the lugs 27 can also be riveted instead of being bent in order to render possible a connection between the heat sink and the motor housing.

In a further alternative exemplary embodiment, not illustrated in the figures, the heat sink 30 can also be of stepped design in such a way that an end side 33 of the heat sink 30 additionally bears against an inner wall 24 or else the heat sink 30 bears against an outer wall 26 of the motor housing 20, in a region in which the heat sink 30 protrudes beyond the motor housing 20.

Figure 3:
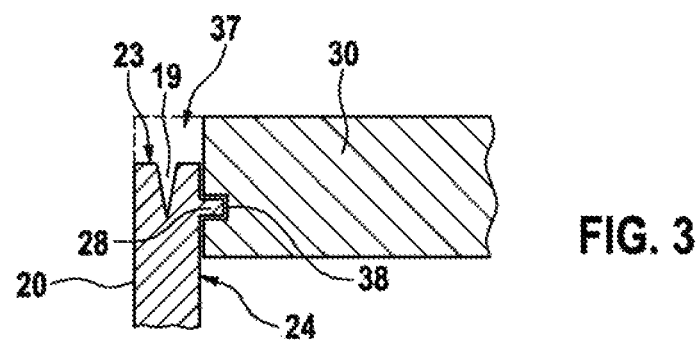
FIG. 3 shows a cross section through a third exemplary embodiment of a connection according to the disclosure between the heat sink and the motor housing.

FIG. 3 shows a cross section through a third exemplary embodiment of a connection according to the disclosure between the heat sink and the motor housing. Said figure illustrates a detail of the motor housing 20 which has a tongue 28 on an inner wall 24 of the motor housing 20. The tongue 28 engages into a groove 38 which is formed on an end side 33 of the heat sink 30, and is calked with said groove. The end side 23 of the motor housing 20 additionally has a gap 29 in a region in which the motor housing 20 has the tongue 28 on the inner wall 24. In addition, the heat sink 30 has a recess 37 partially in the region of the end side 23 of the motor housing 20, which recess renders possible access to the end side 23 and accordingly to the gap 29. The gap 29 allows the heat sink 30 to be inserted into the motor housing 20 more easily, and then the tongue 28 can be inserted into the groove 38 since the gap 29 has a slightly resilient effect. In addition, calking of the heat sink 30 with the motor housing 20 can be achieved by inserting a calking tool into the gap 29.

In an alternative exemplary embodiment, not illustrated in the figures, the heat sink 30 has a tongue and the motor housing 20 has a groove, this accordingly being a reverse design of the tongue-and-groove connection as illustrated in FIG. 3.

In a further alternative exemplary embodiment, not illustrated in the figures, the end side 23 of the motor housing 20 can also be configured without the gap 29. Here, the calking tool then has to be configured, for example, in such a way that it can split the end side 23 of the motor housing itself or else can calk the tongue-and-groove connection in some other way.

Figure 4:
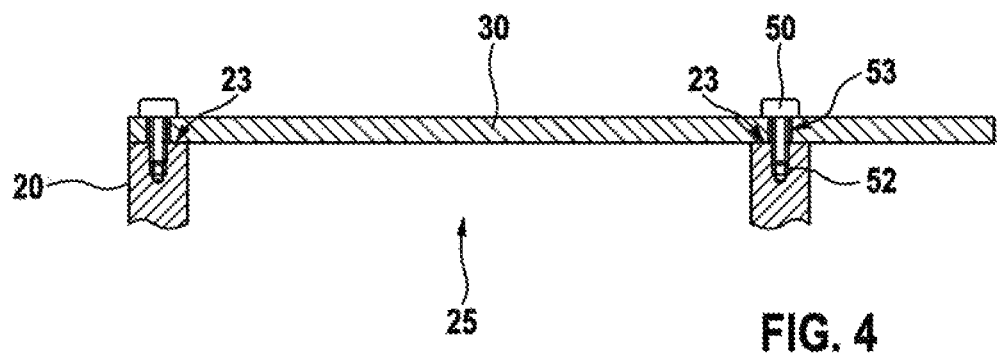
FIG. 4 shows a cross section through a fourth exemplary embodiment of a connection according to the disclosure between the heat sink and the motor housing.

FIG. 4 shows a cross section through a fourth exemplary embodiment of a connection according to the disclosure between the heat sink and the motor housing. The heat sink 30 rests on the end side 23 of the motor housing 20. In addition, the heat sink 30 has apertures 53 and the motor housing 20 has a thread 52 which is made in the end side 23, said apertures and thread being designed in alignment with one another, wherein in each case one screw 50 engages into the thread 52 through the apertures 53 and therefore connects the heat sink 30 to the motor housing 20.

However, in an alternative exemplary embodiment, not illustrated in the figures, it is also possible for the aperture 53 to be arranged in the heat sink 30 and the thread 52 to be arranged in the motor housing 20 in such a way that at least one of the screws 50 runs through the or else next to the motor housing 20. Here, the thread 52 is then formed, for example, in the base 21 of the motor housing 20 or else in the end plate of the motor, not illustrated, or else in a radial projection, not illustrated, of the motor housing 20.

Figure 5:
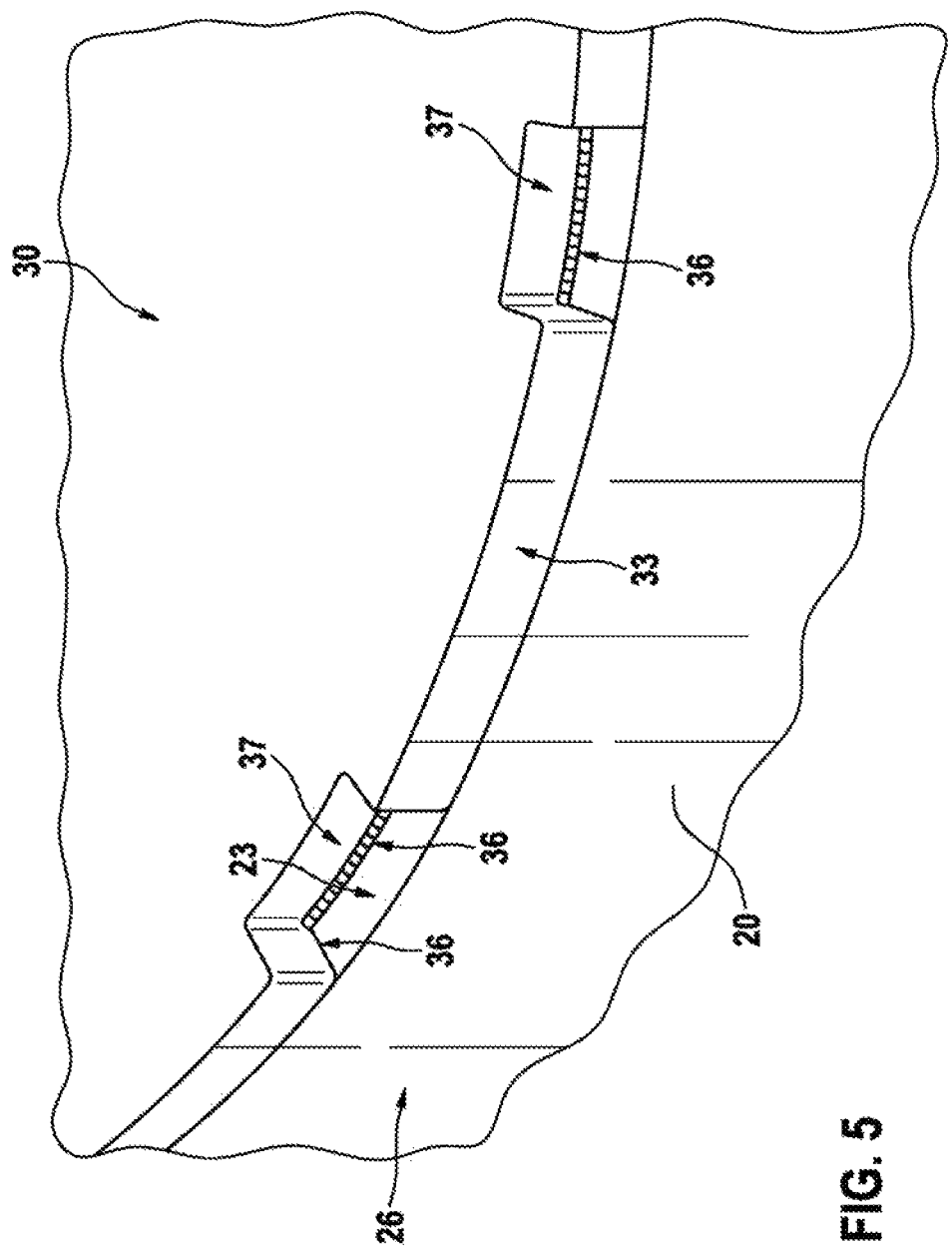
FIG. 5 shows a perspective view of a fifth exemplary embodiment of a connection according to the disclosure between the heat sink and the motor housing.

FIG. 5 shows a perspective view of a fifth exemplary embodiment of a connection according to the disclosure between the heat sink and the motor housing. Said figure illustrates a detail of the motor housing 20 which has a heat sink 30 arranged on its end side 23. Recesses 37 are made in the end side 33 of the heat sink 30, which recesses are configured in such a way that in each case one edge 36 of the recesses 37 bears against the end side 23 of the motor housing 20. In addition, the heat sink 30 is welded to the motor housing 20 at least partially along the edge 36 of the recesses 37 which rests on the end side 23 of the motor housing 20. It would also suffice to weld-on only a subregion of the edge 36.

In an alternative exemplary embodiment, not illustrated in the figures, the recess 37 can also be configured as an aperture and therefore cannot be formed on the end face 33 of the heat sink 30 as long as an edge 36 of the recess 37 bears against the motor housing 20.

In an alternative exemplary embodiment, not illustrated in the figures, the heat sink 30 does not have any recesses 37. In that case, the heat sink 30 is welded to the motor housing 20 at least partially along an edge which bears against the motor housing.

In an exemplary embodiment, not illustrated, of the method according to the disclosure for assembling the power unit 10 for a steering system, a connection is made between a heat sink 30, on which a drive electronics system 40 for a motor of the steering system is arranged, and a motor housing 20 by means of calking or else welding or else screwing.

After the connection between the heat sink 30 and the motor housing 20 is made, a first housing shell 61 is optionally pushed or else pressed onto the motor housing 20 and fixed, in particular adhesively bonded, to the outer wall 24 of the motor housing 20, and then a second housing shell 62 is mounted and connected to the first housing shell 61, in particular by means of laser beam welding or else adhesive bonding. Before the connection between the heat sink 30 and the motor housing 20 is made, for example the heat sink 30 or else the motor housing 20 can be produced by means of deep drawing, bending and stamping a wrought aluminum alloy.

The invention claimed is:

1. A power unit for an electrical steering system, comprising:
    a motor housing configured to accommodate a motor;
    a heat sink; and
    a drive electronics system arranged on the heat sink for the motor, wherein:
    the heat sink and the motor housing are connected to one another such that heat exchange from the drive electronics system, via the heat sink, to the motor housing is possible,
    the heat sink is at least partially connected to the motor housing by at least one of calking, welding, and screwing, and
    the heat sink is at least partially calked with the motor housing by the heat sink having a groove on an end side of the heat sink and the motor housing having a tongue on an inner wall of the motor housing, and the groove and the tongue are calked one into the other.

2. The apparatus as claimed in claim 1, wherein the heat sink, in its main plane of extent, at least partially protrudes beyond the motor housing on an end side of the motor housing in which an opening of the motor housing is located.

3. The apparatus as claimed in claim 1, wherein an end side of the motor housing in which an opening of the motor housing is located is stepped.

4. The apparatus as claimed in claim 1, wherein:
    the heat sink at least partially connected to the motor housing by calking, and
    the calking is formed by: (i) at least one bent or riveted lug, which is formed on an end side of the motor housing in which an opening of the motor housing is located; and (ii) at least one associated recess in the heat sink.

5. The apparatus as claimed in claim 1, wherein the motor housing at least partially has a gap on an end side of the motor housing in a region in which the motor housing has the tongue on the inner wall of the motor housing.

6. The apparatus as claimed in claim 1, wherein:
    the heat sink is at least partially connected to the motor housing by screwing, and
    the screwing is formed by at least one screw which engages into a thread in the motor housing through an aperture in the heat sink.

7. The apparatus as claimed in claim 1, wherein:
    the heat sink is at least partially connected to the motor housing by welding, and
    the welding is laser beam welding.

8. The apparatus as claimed in claim 1, wherein:
    the heat sink has at least one recess,
    a bearing edge of the recess at least partially bears on an end side of the motor housing in which an opening of the motor housing is located, and
    the motor housing is welded to the heat sink at least partially along the bearing edge.

9. The apparatus as claimed in claim 1, wherein the heat sink with the drive electronics system arranged on it is at least partially enclosed by an additional housing.

10. The apparatus as claimed in claim 1, wherein at least one of the motor housing and the heat sink is formed from a wrought aluminum alloy by deep drawing.

11. A method for assembling a power unit having a motor housing configured to accommodate a motor, a heat sink and a drive electronics system, which is arranged on the heat sink, for the motor, the method comprising:
    forming a connection between the heat sink and the motor housing by at least one of calking, welding, and screwing, wherein forming the connection includes:
    inserting a tongue on an inner wall of the motor housing into a groove on an end side of the heat sink.

12. The method as claimed in claim 11, further comprising:
    after forming the connection, pushing a first housing shell onto the motor housing and fixing the first housing shell to an outer wall of the motor housing, and
    mounting and connecting a second housing shell to the first housing shell.

13. The method as claimed in claim 11, wherein at least one of the motor housing and the heat sink is produced by deep drawing a wrought aluminum alloy.

14. The apparatus as claimed in claim 9, wherein the additional housing is a plastic housing.

15. The method as claimed in claim 12, wherein the first housing shell is adhesively bonded to the outer wall of the motor housing.

16. The method as claimed in claim 12, wherein the second housing shell is mounted and connected to the first housing shell by laser beam welding.

17. The method of claim 12, wherein fixing the first housing shell to the outer wall of the motor housing comprises:
    fixing the first housing shell to the outer wall of the motor housing such that the entire first housing shell is lower than the heat sink when the heat sink is mounted above the motor housing.

18. The apparatus as claimed in claim 1, wherein:
    the heat sink is positioned above the motor;
    a first housing shell is fixed onto the motor housing such that the entire first housing shell is lower than the heat sink; and
    a second housing shell is mounted to the first housing shell, the second housing shell extending above the drive electronics system.

19. The apparatus as claimed in claim 5, wherein the gap is located between the inner wall and an outer wall of the motor housing.

\* \* \* \* \*